US012731180B2

(12) United States Patent
Vasavada et al.

(10) Patent No.: US 12,731,180 B2
(45) Date of Patent: Sep. 8, 2026

(54) SYSTEM AND METHOD FOR RECOMMENDING A RECIPE IN A MANUFACTURING PROCESS

(71) Applicant: TVARIT GMBH, Frankfurt Am Main (DE)

(72) Inventors: Jiteshkumar Pareshkumar Vasavada, Junagadh (IN); Manthan Dhisale, Sangli (IN); Sanjay Shekhawat, Nagaur (IN); Nihal Rajan Barde, Sindhudurga (IN); Naga Sai Pranay Modukuru, Offenbach am Main (DE); Kamal Galrani, Neu-Isenburg (DE); Rahul Prajapat, Frankfurt am Main (DE)

(73) Assignee: Tvarit GmbH (DE)

( * ) Notice: Subject to any disclaimer, the term of this patent is extended or adjusted under 35 U.S.C. 154(b) by 519 days.

(21) Appl. No.: 18/192,692

(22) Filed: Mar. 30, 2023

(65) Prior Publication Data

US 2023/0316380 A1 Oct. 5, 2023

(51) Int. Cl.

| | |
|---|---|
| ***G06Q 30/0601*** | (2023.01) |
| ***G06F 30/27*** | (2020.01) |
| ***G06Q 50/04*** | (2012.01) |

(52) U.S. Cl.
CPC ......... *G06Q 30/0631* (2013.01); *G06F 30/27* (2020.01); *G06Q 50/04* (2013.01)

(58) Field of Classification Search
None
See application file for complete search history.

(56) References Cited

U.S. PATENT DOCUMENTS

| | | | | |
|---|---|---|---|---|
| 6,298,898 | B1 * | 10/2001 | Mahadeva ............. | B22D 46/00 164/4.1 |
| 11,493,665 | B1 * | 11/2022 | Putcha .................... | E21B 43/00 |

(Continued)

FOREIGN PATENT DOCUMENTS

| | | |
|---|---|---|
| WO | 2019180466 A1 | 9/2019 |
| WO | 2021136872 A1 | 7/2021 |

OTHER PUBLICATIONS

F. Nadi, A. M. Agogino and D. A. Hodges, "Use of influence diagrams and neural networks in modeling semiconductor manufacturing processes," in IEEE Transactions on Semiconductor Manufacturing, vol. 4, No. 1, pp. 52-58, Feb. 1991, doi: 10.1109/66.75852 (Year: 1991).*

*Primary Examiner* — Michelle T Kringen
(74) *Attorney, Agent, or Firm* — Jason C. Cameron

(57) ABSTRACT

A computer-implemented method for recommending a recipe to produce a product in a manufacturing process is disclosed. The computer-implemented method includes steps of: obtaining experimental data from a machine; generating a physics-based-simulation model based on the experimental data obtained from the machine; generating synthetic data for a first plurality of recipes using the physics-based-simulation model; determining an optimized physical range from physical ranges of each parameter by analyzing the experimental data and the synthetic data using a trained AI model; generating a second plurality of recipes when the optimized physical range of each parameter creating the second plurality of recipes is valid; validating the second plurality of recipes to extract an optimized recipe using the physics-based-simulation model; and recommending the optimized recipe for producing the product in the machine.

12 Claims, 11 Drawing Sheets

(56) References Cited

U.S. PATENT DOCUMENTS

| | | | | |
|---|---|---|---|---|
| 12,585,272 | B1 * | 3/2026 | Jang | G05D 1/0088 |
| 2015/0112907 | A1 * | 4/2015 | Nasle | G05B 13/026 706/21 |
| 2019/0278261 | A1 | 9/2019 | Shibuya et al. | |
| 2020/0394618 | A1 | 12/2020 | Davis et al. | |
| 2021/0182466 | A1 * | 6/2021 | Le | G06N 3/08 |
| 2021/0208545 | A1 * | 7/2021 | Zhang | G05B 13/042 |
| 2022/0187847 | A1 * | 6/2022 | Cella | G06Q 10/06395 |

* cited by examiner

SYSTEM AND METHOD FOR RECOMMENDING A RECIPE IN A MANUFACTURING PROCESS

EARLIEST PRIORITY DATE

This application claims priority from a Provisional patent application filed in India having Patent Application No. 202241019365, filed on Mar. 31, 2022, and titled "METHOD TO INTEGRATE PHYSICS-BASED SIMULATION WITH ARTIFICIAL INTELLIGENCE MODEL FOR RECOMMENDING RECIPE IN DIE CASTING PROCESS".

FIELD OF INVENTION

Embodiments of the present disclosure relate to Artificial Intelligence (AI), machine learning (ML) and data analytics and more particularly relate to a system and method for recommending a recipe to produce a product in a manufacturing process by integrating a physics-based-simulation model with an AI/ML model.

BACKGROUND

Manufacturing industries produce a product (i.e., a component) through different processes such as casting, forging, machining, and the like. Die casting process is one of casting processes in which molten metal is forced into a cavity created using permanent molds. The components produced through the die casting process are rejected due to arising defects in the components, which is beyond acceptable limit. The reason behind defective components may be due to unoptimized process parameters, environmental conditions, machine conditions, improper machine maintenance, and the like.

Existing solution optimizes process parameters through physics-based-simulation. However, the physics-based-simulation does not incorporate the environmental condition, the machine condition, the machine maintenance to optimize the process parameters. In reality, recipes utilized to produce the component are very limited. Hence, an artificial intelligence model trained on only experimental data has very limited exposure and low accuracy.

One of the limitations of the physics-based-simulation is that the physics-based-simulation may not capture the effect of environmental conditions, die conditions, aging of a machine part, maintenance parameters, and the like. Environmental parameters including ambient temperature and humidity play a major role in producing defective components in the die-casting process. Moreover, the die condition and aging of the machine part also contribute to produce the defective component.

In reality, actual measured values deviate from a setpoint, which may impact the quality of the component. For example, in the die-casting process, pre-heat temperature of a mould is set to 350° C. However actual values may vary between 250° C. to 450° C., which may also contribute to degrade the quality of the product. The effects of the aforementioned parameters may not be captured through the physics-based-simulation.

In an exemplary embodiment, one of the existing prior art U.S. Pat. No. 6,298,898B1 discloses a method of optimizing cycle time and casting quality in making of a cast metal product which has been defined by a computer aided design (CAD) product model. The method involves steps of (a) providing a computer casting model using objective functions that simulate filling and solidification of the CAD product model within a die, (b) adapting objective function terms based on experimental data to calibrate the casting model measured thermal data, to derive matching heat transfer coefficients for each region, and to simulate the filling and solidification of the CAD product within said die, (c) constraining the objective functions to ensure directional solidification along the series of contiguous sections while optimizing thermal conductivity and heat capacity, and (d) iteratively evaluating the constrained objective functions to indicate which regions of the casting model can have chills, cooling channels or insulation added to effect improved cycle time and casting quality. Though, the existing technology helps in improving the quality of the cast metal product based on the above mentioned process, the reduction of scrap rate of the cast metal product is not achieved.

Therefore, there is a need for an improved system and method for recommending a recipe in a manufacturing process, to address the aforementioned issues.

SUMMARY

This summary is provided to introduce a selection of concepts, in a simple manner, which is further described in the detailed description of the disclosure. This summary is neither intended to identify key or essential inventive concepts of the subject matter nor to determine the scope of the disclosure.

In accordance with one embodiment of the disclosure, a computer-implemented method for recommending a recipe to produce a product in a manufacturing process is disclosed. The method includes a step of obtaining experimental data from a machine. In an embodiment, the experimental data include at least one of: recipe data, sensor data, and metadata of the machine. The recipe data include a plurality of parameters that is set to the machine to produce the product.

The computer-implemented method further includes generating a physics-based-simulation model based on the experimental data obtained from the machine. The computer-implemented method further includes generating synthetic data for a first plurality of recipes using the physics-based-simulation model. In an embodiment, the first plurality of recipes that is created based on physical ranges of each parameter from the plurality of parameters.

The computer-implemented method further includes determining an optimized physical range of each parameter from the physical ranges of each parameter by analyzing the experimental data and the synthetic data using a trained AI model. The computer-implemented method further includes determining whether the optimized physical range of each parameter creating a second plurality of recipes is valid.

The computer-implemented method further includes generating the second plurality of recipes when the optimized physical range of each parameter creating the second plurality of recipes is valid. The computer-implemented method further includes validating the second plurality of recipes to extract an optimized recipe using the physics-based-simulation model. The computer-implemented method further includes recommending the optimized recipe for producing the product in the machine.

In an embodiment, generating the physics-based-simulation model includes obtaining input data from the machine; generating the physics-based-simulation model by providing initial values for the physical range of each parameter; extracting simulation data from one or more sensors that are installed in the machine; determining an error between the extracted simulation data and experimental sensor data;

determining whether the error exceeds a threshold value; utilizing the physics-based-simulation model to generate the synthetic data similar to the experimental data for the first plurality of recipes when the error is within the threshold value.

In an embodiment, the input data include at least one of: geometries of the product in a form of computer aided design (CAD) model, material properties of the product and one or more parts of the machine, the plurality of parameters that are set for the machine for producing the product, and initial and boundary conditions that are identified based on the experimental data and applied in the physics-based-simulation model. The geometries of the product include die and sub-parts of the machine which are assembled in the CAD model similar to an experimental setup of the product.

In another embodiment, generating the physics-based-simulation model further includes adjusting the value of the physical range of each parameter to generate the physics-based-simulation model when the error exceeds the threshold value.

In yet another embodiment, determining the optimized physical range of each parameter from the physical ranges of each parameter using the trained AI model includes receiving the experimental data and the synthetic data as an input at the trained AI model; performing data cleaning and preparation processes; extracting statistical features from the data including at least one of: mean, median, standard deviation, an area under curve from the one or more sensors; splitting the extracted statistical features into a train set and a test set; training the AI model based on hyper-parameters of the AI model on the train set; evaluating the trained AI model on the test set; determining one or more flaws using the trained AI model to provide recommendations for a defective product; and recommending the optimized recipe by analyzing the experimental data using the trained AI model. In an embodiment, the data cleaning and preparation processes include at least one of removing outliers and handling missing data.

In yet another embodiment, validating the second plurality of recipes to extract the optimized recipe using the physics-based-simulation model includes simulating the second plurality of recipes to generate a plurality of outputs of the product from the machine; analyzing the plurality of outputs generated for the second plurality of recipes; and comparing the second plurality of recipes with the plurality of outputs to extract the optimized recipe from the second plurality of recipes. The plurality of outputs includes at least one of: a size, a shape and a location of the defect, a hot spot location, temperature distribution in a mold in the machine.

In yet another embodiment, the plurality of parameters includes at least one of: molten metal temperature, pre-heat temperature, cooling channel parameters, heat transfer coefficient between the mold and a molten metal, the heat transfer coefficient between the mold and a cooling channel, pressure, and flow of air, which are set for the machine to produce the product. The machine is a low pressure die casting (LPDC) machine.

In yet another embodiment, the first plurality of recipes are created based on the physical range of each parameter of the recipe using a process knowledge. In yet another embodiment, determining whether the optimized physical range of each parameter creating the second plurality of recipes is valid using the process knowledge includes comparing the second plurality of recipes that are created by the optimized physical range of each parameter with predetermined plurality of recipes created from the plurality of parameters; and determining whether the second plurality of recipes created by the optimized physical range of each parameter is valid based on the comparison of the second plurality of recipes that are created by the optimized physical range of each parameter with the predetermined plurality of recipes created from the plurality of parameters using the process knowledge.

In yet another embodiment, the recipe data include the plurality of parameters that are set for the machine to produce a type of the product. The sensor data include data collected from the one or more sensors installed on the machine. The metadata include a label corresponding to at least one of: a defective or a non-defective part of the machine, a geometry, a location of the one or more sensors, a product type, information related to maintenance, environmental parameters, first information related to replacing the part of the machine and information related to the machine, and a machine part.

In yet another embodiment, the experimental data and the synthetic data are inputted into a machine learning (ML) model to train the ML model.

In one aspect, a system for recommending a recipe to produce a product in a manufacturing process is disclosed. The system includes one or more hardware processors, and a memory that is coupled to the one or more hardware processors. The memory includes a set of program instructions in the form of a plurality of subsystems, configured to be executed by the one or more hardware processors. The plurality of subsystems includes a data obtaining subsystem, a simulation generation subsystem, a synthetic data generation subsystem, and a recipe recommendation subsystem.

The data obtaining subsystem obtains experimental data from a machine. The experimental data include at least one of: recipe data, sensor data, and metadata of the machine. The recipe data include a plurality of parameters that is set for the machine to produce the product. The simulation generation subsystem generates a physics-based-simulation model based on the experimental data obtained from the machine.

The synthetic data generation subsystem generates synthetic data for a first plurality of recipes using the physics-based-simulation model. The first plurality of recipes that is created based on physical ranges of each parameter from the plurality of parameters.

The recipe recommendation subsystem determines an optimized physical range of each parameter from the physical ranges of each parameter by analyzing the experimental data and the synthetic data using a trained AI model. The recipe recommendation subsystem further determines whether the optimized physical range of each parameter creating a second plurality of recipes is valid. The recipe recommendation subsystem further generates the second plurality of recipes when the optimized physical range of each parameter creating the second plurality of recipes is valid. The recipe recommendation subsystem further validates the second plurality of recipes to extract an optimized recipe using the physics-based-simulation model. The recipe recommendation subsystem finally recommends the optimized recipe for producing the product in the machine.

To further clarify the advantages and features of the present disclosure, a more particular description of the disclosure will follow by reference to specific embodiments thereof, which are illustrated in the appended figures. It is to be appreciated that these figures depict only typical embodiments of the disclosure and are therefore not to be considered limiting in scope. The disclosure will be described and explained with additional specificity and detail with the appended figures.

BRIEF DESCRIPTION OF THE DRAWINGS

The disclosure will be described and explained with additional specificity and detail with the accompanying figures in which.

Figure 1:
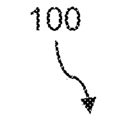
FIG. 1 is a block diagram of a system for recommending a recipe to produce a product in a manufacturing process by integrating a physics-based-simulation model with an Artificial Intelligence (AI) model, in accordance with an embodiment of the present disclosure.
Figure 1:
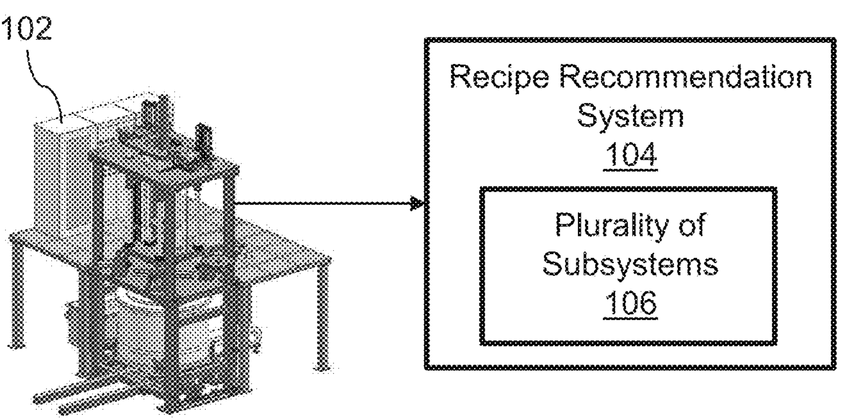

Further, those skilled in the art will appreciate that elements in the figures are illustrated for simplicity and may not have necessarily been drawn to scale. Furthermore, in terms of the construction of the device, one or more components of the device may have been represented in the figures by conventional symbols, and the figures may show only those specific details that are pertinent to understanding the embodiments of the present disclosure so as not to obscure the figures with details that will be readily apparent to those skilled in the art having the benefit of the description herein.

DETAILED DESCRIPTION

For the purpose of promoting an understanding of the principles of the disclosure, reference will now be made to the embodiment illustrated in the figures and specific language will be used to describe them. It will nevertheless be understood that no limitation of the scope of the disclosure is thereby intended. Such alterations and further modifications in the illustrated online platform, and such further applications of the principles of the disclosure as would normally occur to those skilled in the art are to be construed as being within the scope of the present disclosure.

The terms "comprises", "comprising", or any other variations thereof, are intended to cover a non-exclusive inclusion, such that a process or method that comprises a list of steps does not include only those steps but may include other steps not expressly listed or inherent to such a process or method. Similarly, one or more devices or subsystems or elements or structures or components preceded by "comprises . . . a" does not, without more constraints, preclude the existence of other devices, subsystems, elements, structures, components, additional devices, additional subsystems, additional elements, additional structures or additional components. Appearances of the phrase "in an embodiment", "in another embodiment" and similar language throughout this specification may, but not necessarily do, all refer to the same embodiment.

Unless otherwise defined, all technical and scientific terms used herein have the same meaning as commonly understood by those skilled in the art to which this disclosure belongs. The system, methods, and examples provided herein are only illustrative and not intended to be limiting.

In the following specification and the claims, reference will be made to a number of terms, which shall be defined to have the following meanings. The singular forms "a", "an", and "the" include plural references unless the context clearly dictates otherwise.

A computer system (standalone, client or server computer system) configured by an application may constitute a "module" (or "subsystem") that is configured and operated to perform certain operations. In one embodiment, the "module" or "subsystem" may be implemented mechanically or electronically, so a module include dedicated circuitry or logic that is permanently configured (within a special-purpose processor) to perform certain operations. In another embodiment, a "module" or "subsystem" may also comprise programmable logic or circuitry (as encompassed within a general-purpose processor or other programmable processor) that is temporarily configured by software to perform certain operations.

Accordingly, the term "module" or "subsystem" should be understood to encompass a tangible entity, be that an entity that is physically constructed permanently configured (hardwired) or temporarily configured (programmed) to operate in a certain manner and/or to perform certain operations described herein.

FIG. 1 is a block diagram of a system 100 for recommending a recipe to produce a product (i.e., a component) in a manufacturing process by integrating physics-based-simulation model with an Artificial Intelligence (AI) model, in accordance with an embodiment of the present disclosure. In an embodiment, the manufacturing process may include a die casting process where the recipe is prescribed to produce the product. The system 100 includes a machine 102 (e.g., a low pressure die casting (LPDC) machine), and a recipe recommendation system 104. The recipe recommendation system 104 includes a plurality of subsystems 106.

The system 100 initially obtains experimental data that include at least one of: recipe data, sensor data, and metadata from the machine 102. The system 100 further generates a physics-based-simulation model based on the experimental data obtained from the machine 102. Further, the system 100 tunes the physics-based-simulation model by adjusting physical range of parameters to minimize an error between the sensor data and simulation data corresponding to the sensor data.

The system 100 further generates synthetic data similar to the experimental data for a list of recipes (i.e., a first plurality of recipes) using the physics-based-simulation model. The system 100 further inputs the experimental data and the synthetic data into the artificial intelligence (AI) model to train the AI model. The system 100 further determines an optimized physical range of each parameter from physical ranges of each parameter by analyzing the experimental data and the synthetic data using the trained AI model.

The system 100 further determines whether the optimized physical range of each parameter used to create a plurality of recipes (i.e., a second plurality of recipes) is valid based on a process knowledge. Upon determination, the system 100 generates the second plurality of recipes when the optimized range of each parameter used to create the second plurality of recipes is valid. The system 100 further validates the second plurality of recipes to extract an optimized recipe using the physics-based-simulation model in order to recommend the optimized recipe for producing the product in the machine 102. Hence, the system 100 integrates the physics-based-simulation model and the AI model to prescribe the optimized recipe for producing the product.

In an embodiment, the recipe recommendation system 104 may be hosted on a central server including at least one of: a cloud server, a remote server, and the like. In another embodiment, the recipe recommendation system 104 as the central server may obtain the experimental data from the machine 102 through a network (now shown) and process the experimental data with above mentioned methods to recommend the optimized recipe for producing the product in the machine 102. In an embodiment, the network may be at least one of: a Wireless-Fidelity (Wi-Fi) connection, a hotspot connection, a Bluetooth connection, a local area network (LAN), a wide area network (WAN), any other wireless network, and the like.

Figure 2:
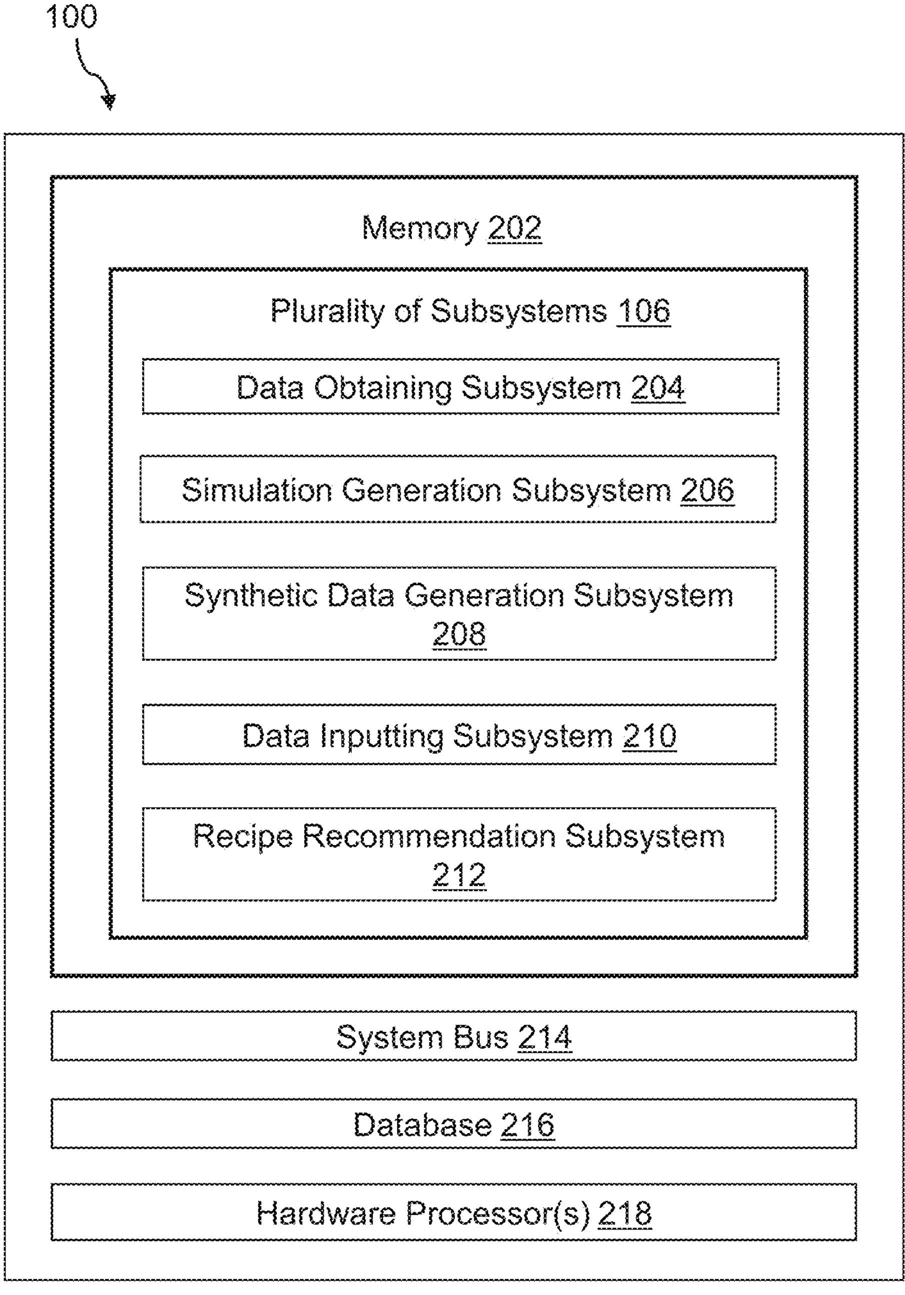
FIG. 2 is a detailed view of the system, such as those shown in FIG. 1, in accordance with an embodiment of the present disclosure.

FIG. 2 is a detailed view of the system 100, such as those shown in FIG. 1, in accordance with an embodiment of the present disclosure. The system 100 includes one or more hardware processor(s) 218. The system 100 further includes a memory 202 coupled to the one or more hardware processor(s) 218. The memory 202 includes a set of program instructions in the form of the plurality of subsystems 106.

The one or more hardware processor(s) 218, as used herein, means any type of computational circuit, such as, but not limited to, a microprocessor, a microcontroller, a complex instruction set computing microprocessor, a reduced instruction set computing microprocessor, a very long instruction word microprocessor, an explicitly parallel instruction computing microprocessor, a digital signal processor, or any other type of processing circuit, or a combination thereof.

The memory 202 includes the plurality of subsystems 106 stored in the form of executable program which instructs the one or more hardware processor(s) 218 via a system bus 214 to perform the above-mentioned method steps. The plurality of subsystems 106 includes following subsystems: a data obtaining subsystem 204, a simulation generation subsystem 206, a synthetic data generation subsystem 208, a data inputting subsystem 210, and a recipe recommendation subsystem 212.

Computer memory elements may include any suitable memory device(s) for storing data and executable program, such as read only memory, random access memory, erasable programmable read only memory, electronically erasable programmable read only memory, hard drive, removable media drive for handling memory cards and the like. Embodiments of the present subject matter may be implemented in conjunction with program modules, including functions, procedures, data structures, and application programs, for performing tasks, or defining abstract data types or low-level hardware contexts. Executable program stored on any of the above-mentioned storage media may be executable by the one or more hardware processor(s) 218.

The plurality of subsystems 106 includes the data obtaining subsystem 204 that is communicatively connected to the one or more hardware processor(s) 218. The data obtaining subsystem 204 obtains the experimental data from the machine 102. In an embodiment, the experimental data include at least one of: the recipe data, the sensor data, and the metadata of the machine 102. The recipe data include the plurality of parameters that is set for the machine 102 to produce the product. In other words, the plurality of parameters may include values that are set for the machine 102 to produce the product. In an embodiment, the recipe data include set parameters for the machine 102 to produce a specific type of the product (i.e., the component). The sensor data include data collected from one or more sensors (shown in FIG. 6B) installed on the machine 102. The metadata include information including at least one of: a label corresponding to defective or non-defective part, a geometry, a location of the one or more sensors, a type of the product, and the like.

The plurality of subsystems 106 further includes the simulation generation subsystem 206 that is communicatively connected to the one or more hardware processor(s) 218. The simulation generation subsystem 206 generates a physics-based-simulation model based on the experimental data obtained from the machine 102. In an embodiment, the physics-based-simulation model is tuned by adjusting the physical range of parameters to minimize the error between the sensor data and the simulation data corresponding to the sensor data. The generation of the physics-based-simulation model based on the experimental data is explained in detail in FIG. 4.

The plurality of subsystems 106 further includes the synthetic data generation subsystem 208 that is communicatively connected to the one or more hardware processor(s) 218. The synthetic data generation subsystem 208 generates the synthetic data similar to the experimental data for the list of recipes (i.e., the first plurality of recipes) using the physics-based-simulation model. In an embodiment, the synthetic data include at least one of: the recipe data, the sensor data and the metadata generated from the physics-based-simulation model. In an embodiment, the list of recipes is created based on the process knowledge by considering the physical ranges of each parameter from the plurality of parameters. For example, a Low Pressure Die Casting (LPDC) process is used to produce the component from Aluminum or other alloys. The physical range of a set-point for the melting temperature (i.e., the parameter) of the Aluminum should be between 680° C. to 740° C. Therefore, the set point of a molten metal holding in a furnace attached with the LPDC machine 102 should be between above-mentioned physical range. Similarly, the physical range for other parameters including at least one of pressure, flow of the air, and the like can be defined based on the machine 102 and the product produced through the LPDC process.

The plurality of subsystems 106 optionally includes the data inputting subsystem 210 that is communicatively connected to the one or more hardware processor(s) 218. The data inputting subsystem 210 inputs the experimental data and the synthetic data into the artificial intelligence (AI) model to train the AI model. In an embodiment, a machine learning (ML) model may be trained by receiving the experimental data and the synthetic data into the ML model.

The plurality of subsystems 106 further includes the recipe recommendation subsystem 212 that is communicatively connected to the one or more hardware processor(s) 218. The recipe recommendation subsystem 212 determines the optimized physical range of each parameter from the physical ranges of each parameter by analyzing the experimental data and the synthetic data using the trained AI model. For example, the AI model determines 710° C. as an optimized value for the set point of the molten metal holding in the furnace attached with the LPDC machine 102. Determining the optimize physical range of each parameter from the physical ranges of each parameter is explained in detail in FIG. 5.

The recipe recommendation subsystem 212 further determines whether the optimized physical range of each parameter used to create the plurality of recipes (i.e., the second plurality of recipes) is valid based on the process knowledge. The process knowledge includes a knowledge of the at least one of: the process (e.g., the LPDC process) and corresponding machines 102, the one or more sensors, and the like. The process knowledge further includes at least one of analyzing of the machine 102, the plurality of parameters (i.e., process parameters) which are set to the machine 102, the plurality of parameters measured through the one or more sensors, limits of each of the plurality parameters, and the like. The recipe recommendation subsystem 212 initially compares the second plurality of recipes that are created by the optimized physical range of each parameter with predetermined plurality of recipes created from the plurality of parameters. The recipe recommendation subsystem 212 further determines whether the second plurality of recipes created by the optimized physical range of each parameter is valid based on the comparison of the second plurality of recipes that are created by the optimized physical range of each parameter with the predetermined plurality of recipes created from the plurality of parameters using the process knowledge.

The recipe recommendation subsystem 212 further generates the plurality of recipes (i.e., the second plurality of recipes) when the optimized physical range of each parameter used to create the second plurality of recipes is valid. The recipe recommendation subsystem 212 further validates the second plurality of recipes to extract the optimized recipe using the physics-based-simulation model. The physics-based-simulation model simulates the second plurality of recipes to generate a plurality of outputs corresponding to the product. In an embodiment, the plurality of outputs may include a size, a shape and a location of the defect, a hot spot location, temperature distribution in a mold in the machine 102. The plurality of outputs are analyzed for the second plurality of the recipes. The second plurality of the recipes with the plurality of outputs are compared to extract the optimized recipe from the second plurality of recipes. The recipe recommendation subsystem 212 recommends/prescribes the optimized recipe for producing the product in the machine 102.

Figure 3:
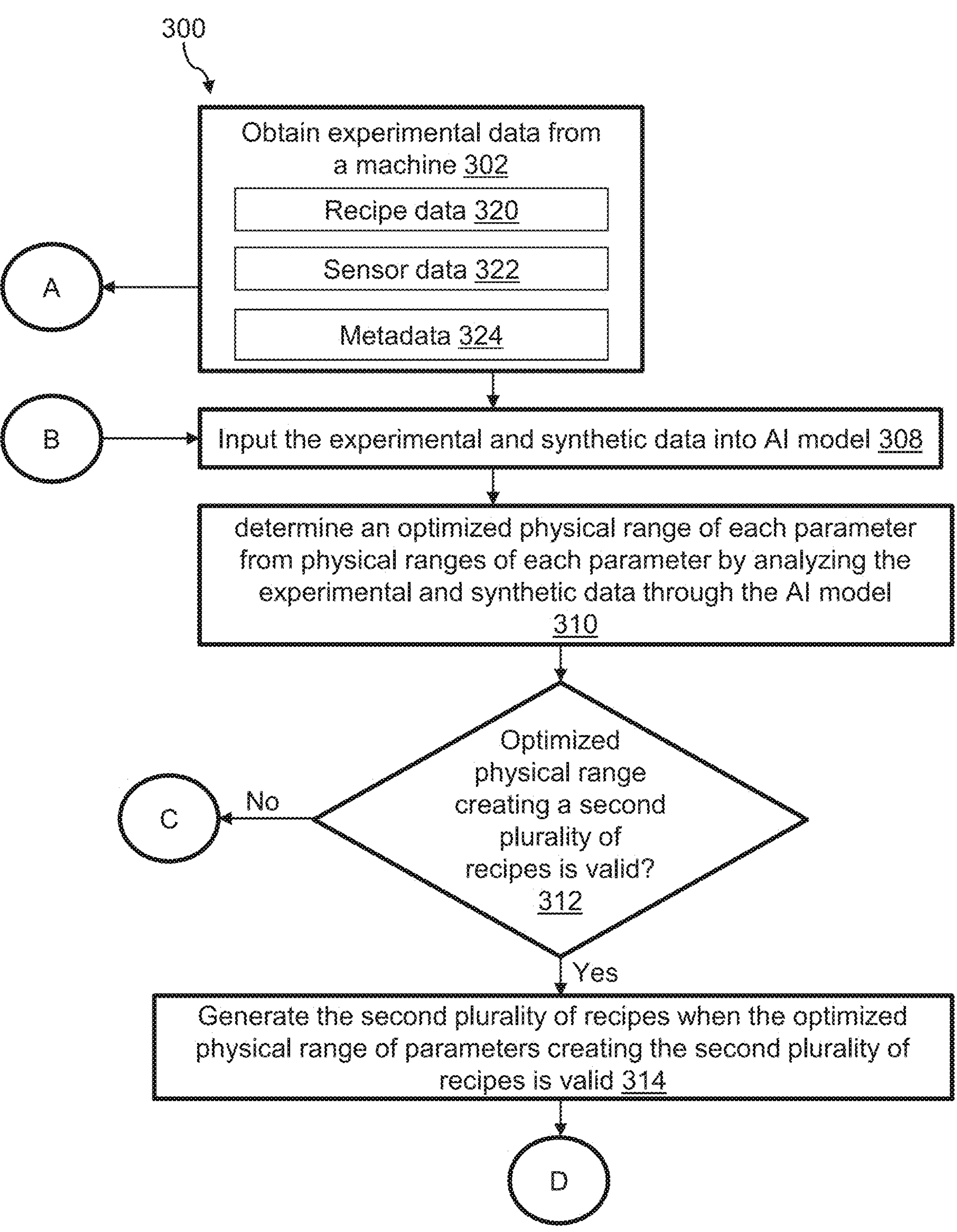
FIG. 3 is a process flow for recommending an optimized recipe to produce the product in a die casting process by integrating the AI model and the physics-based-simulation model, such as those shown in FIG. 1, in accordance with an embodiment of the present disclosure.
Figure 3:
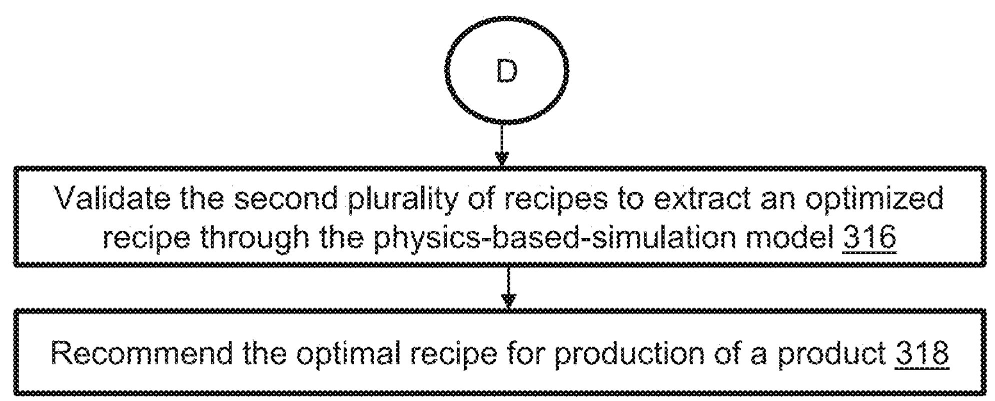
Figure 3:
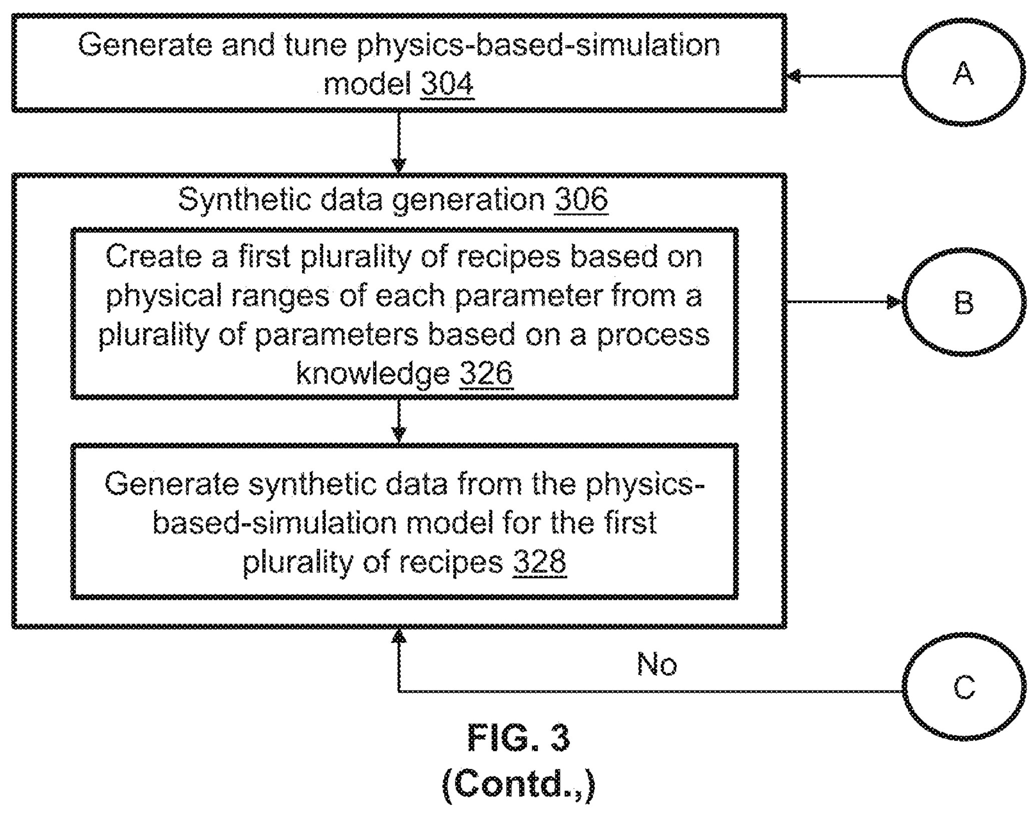

FIG. 3 is a process flow 300 for recommending the optimized recipe to produce the product in the die casting process by integrating the AI model and the physics-based-simulation model, such as those shown in FIG. 1, in accordance with an embodiment of the present disclosure. At step 302, the experimental data are obtained from the machine 102. The experimental data include the recipe data 320, the sensor data 322 and the metadata 324. The recipe data 320 include the plurality of parameters that are set for the machine 102 to produce the specific type of product. The sensor data 322 include the data collected from the one or more sensors installed on the machine 102. The metadata 124 include the information including at least one of: the label corresponding to the defective or the non-defective part, the geometry, the location of the one or more sensors, the type of the product, and the like.

At step 304, the physics-based-simulation model is generated based on the experimental data obtained from the machine 102. Further, at step 304, the physics-based-simulation model is tuned by adjusting the physical range of parameters in order to minimize the error between the sensor data 322 and the simulation data corresponding to the sensor data 322. The tuned physics-based-simulation model is utilized to generate the synthetic data at step 306. At sub-step 326 of the step 306, the list of recipes (i.e., the first plurality of recipes) is created based on the process knowledge by considering the physical ranges of each parameter from the plurality of parameters. At sub-step 328 of the step 306, the synthetic data are generated for the list of the recipes using the physics-based-simulation model. In other words, the synthetic data are generated for the list of the recipes using the tuned physics-based-simulation model.

At the step 308, the method includes prediction and prescription of the AI/ML model preparation. In other words, at step 308, the experimental data and the synthetic data are inputted into the AI/ML model to train the AI/ML model. At step 310, the trained AI/ML model determines the optimized range of each parameter from the physical ranges of each parameter by analyzing the data (i.e., the experimental data and the synthetic data) using the trained AI/ML model.

At step 312, a check is done if the optimized physical range of each parameter utilized to create the plurality of recipes (i.e., the second plurality of recipes) is correct (i.e., valid) based on the process knowledge. If yes, At step 314, the plurality of recipes (i.e., the second plurality of recipes) is generated from the range of parameters. At step 316, the second plurality of recipes are validated through the physics-based-simulation model in order to extract the optimized recipe. At step 318, the optimized recipe is suggested/recommended for production of the product. If no, the steps from 306 are repeated.

Figure 4:
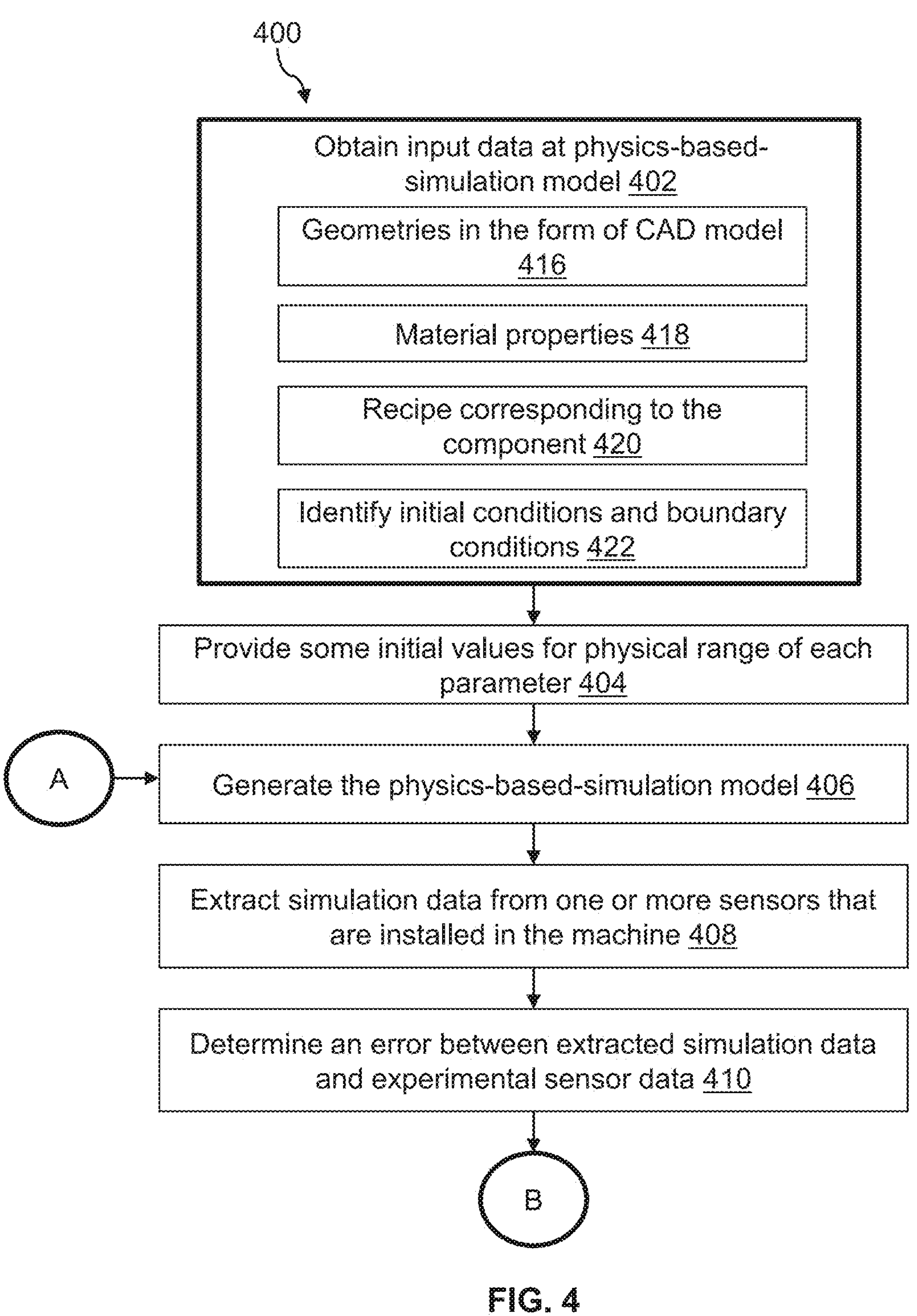
FIG. 4 is a process flow depicting a method of generating and tuning the physics-based-simulation model, in accordance with an embodiment of the present disclosure.
Figure 4:
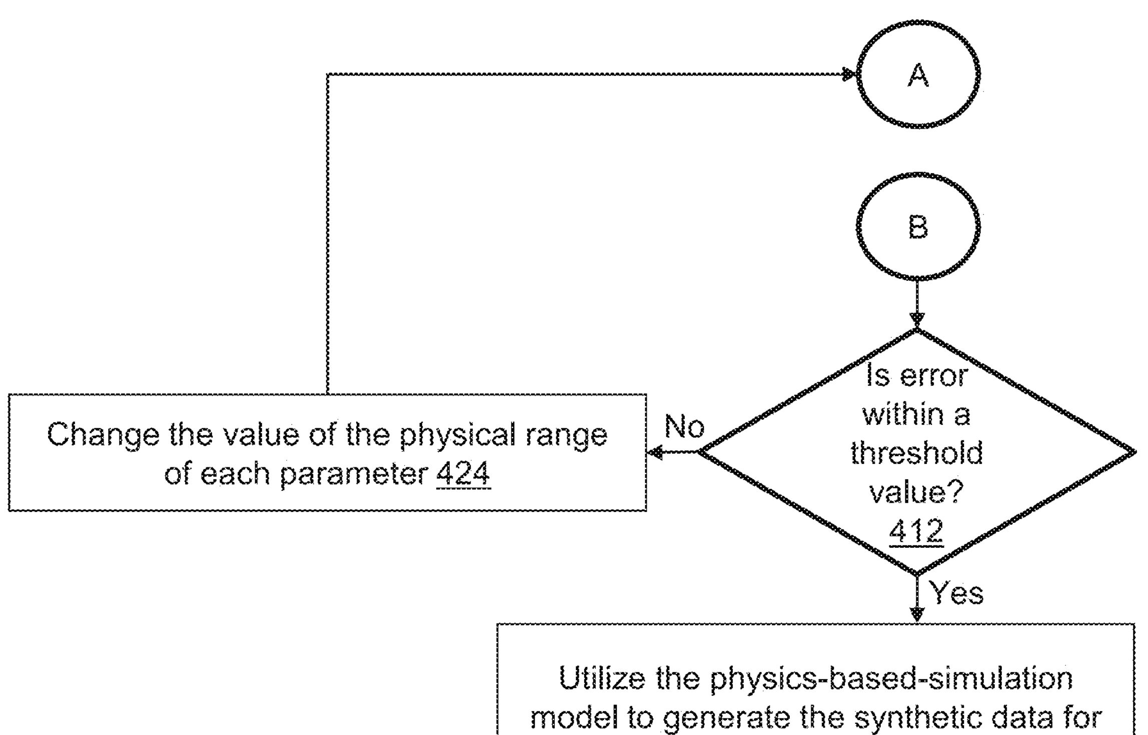

FIG. 4 is a process flow 400 depicting a method of generating and tuning the physics-based-simulation model, in accordance with an embodiment of the present disclosure. At step 402, input data are obtained to generate the physics-based-simulation model. At sub-step 416 of the step 402, geometries of the product (i.e., the component) are obtained in a form of a Computer Aided Design (CAD) model. In an embodiment, the geometries of the product may include die and other parts/sub-parts of the machine 102, which are assembled in the CAD model similar to an experimental setup of the component. At sub-step 418 of the step 402, material properties of the product and one or more machine parts are further utilized to generate the physics-based-simulation model. In an embodiment, the material properties may refer to at least one of: a kind of the product, a kind of materials used for producing the product, and the like. Further, the method includes extracting the recipes that are set for the machine for producing a specific component.

At sub-step 420 of the step 402, the recipes are utilized to generate the physics-based-simulation model for simulating the die casting process to produce the same component. At sub-step 422 of the step 402, boundary conditions and initial conditions are identified based on the experimental setup and applied in the physics-based-simulation model. For example, to setup the physics-based-simulation model for the Low Pressure Die Casting process, the initial conditions are at least one of: positional constraint of the mold, initial temperature of the mold, and the like, and the boundary conditions for the same LPDC process can be at least one of: pressure cycle, air/water cooling cycles, and the like. At step 404, some initial values for physical range of parameters including at least one of: heat transfer coefficient between the mold and the molten metal, the mold and a cooling channel, and the like are provided for the physics-based-simulation model.

At step 406, the physics-based-simulation model is generated based on the aforementioned steps. At step 408, the simulation data are extracted from the one or more sensors that is installed in the machine 102. At step 410, the error between the extracted simulation data and experimental sensor data 322 are determined. At step 412, a check is done if the error exceeds a threshold value. If the error exceeds the threshold value, then at step 424, the value of the physical range of parameters is changed, and the steps 406-410 are repeated. If the error is within the threshold value, then at step 414, the physics-based-simulation model is utilized to generate the synthetic data similar to the experimental data for the first plurality of recipes.

Figure 5:
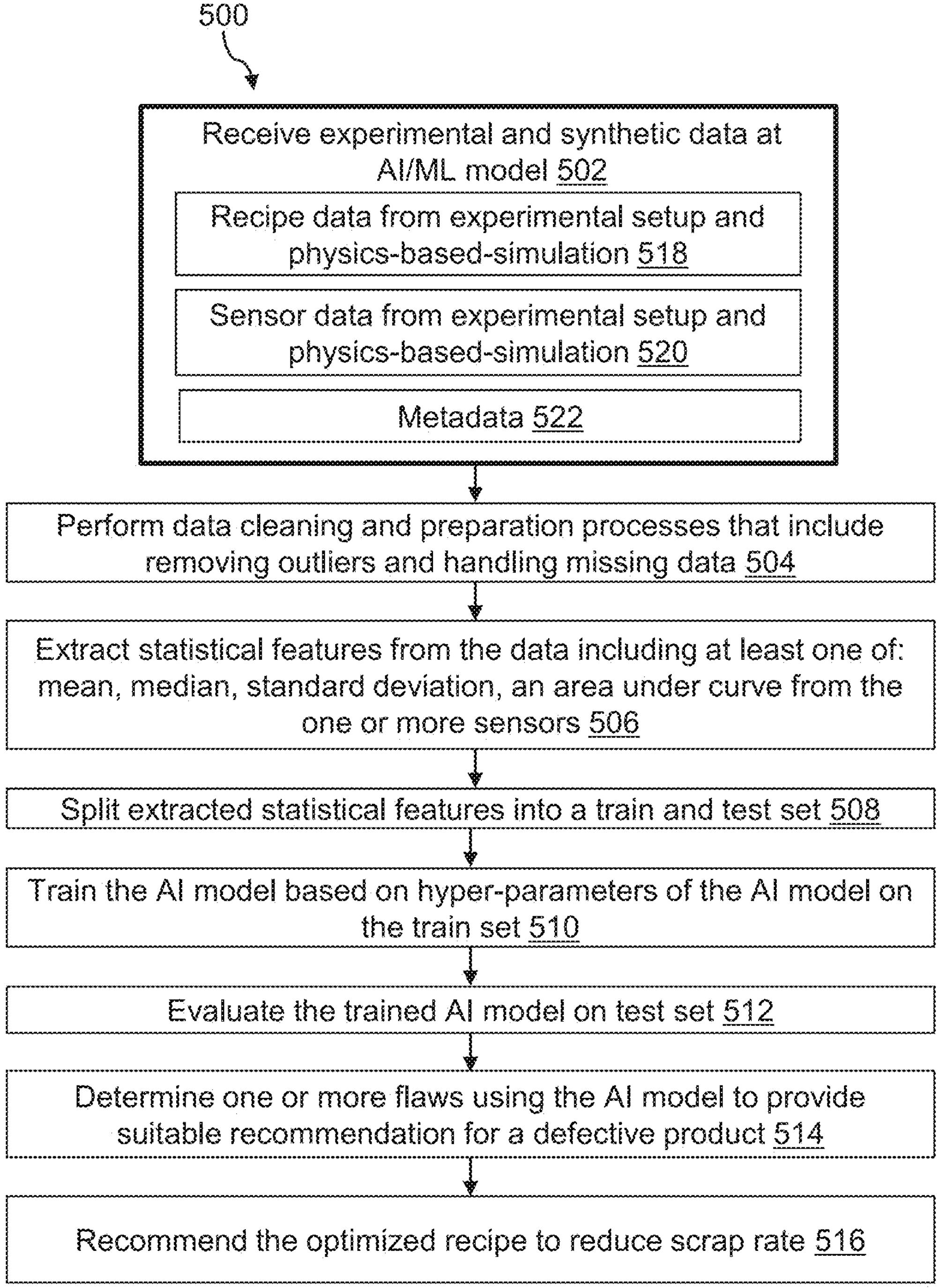
FIG. 5 is a process flow depicting a method of determining the optimized recipe using the AI model, in accordance with an embodiment of the present disclosure.

FIG. 5 is a process flow 500 depicting a method of determining the optimized recipe using the AI model, in accordance with an embodiment of the present disclosure. At step 502, a plurality of input parameters including the synthetic data and the experimental data from the physics-based-simulation model and from the experimental setup respectively are inputted to the AL/ML model to train the AI/ML model. At sub-step 518 of the step 502, the recipe data 320 from the experimental setup and the physics-based-simulation model are provided as an input to the AI/ML model.

At sub-step 520 of the step 502, the sensor data 322 collected from the experimental setup and the physics-based-simulation model are also provided as the input to the AI/ML model. At sub-step 522 of the step 502, the metadata 324 are also provided as the input to the AI/ML model. The metadata 324 may include at least one of: information related to maintenance, environmental parameters, information related to replacing the part and information related to the machine 102, a machine part, and the like.

At step 504, data cleaning and preparation steps that include at least one of removing outliers, handling missing data, and the like are performed. At step 506, statistical features are extracted from the data, which include at least one of mean, median, standard deviation, an area under curve, and the like from the one or more sensors 610 (shown in FIG. 6B) and the metadata 324 are extracted for a number of same components. At step 508, the extracted data are split into a train set and a test set. In an embodiment, the train set and the test set (i.e., time-series train and test set) split are performed on the complete data. For example, 70% of the data for the start can be used to train the AI/ML model and remaining 30% of the data is used to test the AI/ML model At step 510, the AI/ML model is trained and tuned based on hyper-parameters of the AI/ML model on the training set. In other words, the AI/ML model is trained and tuned by adjusting the hyper-parameters of the AI/ML model on the training set. For example, the hyper-parameters for a random forest model are at least one of: maximum depth, number of trees, and the like, which are adjusted to increase an accuracy of the AI/ML model.

At step 512, the trained AI/ML model is evaluated on the test set. At step 514, the trained AI/ML model is utilized to determine root causes (i.e., one or more flaws) and to provide recommendations for a defective component. At step 516, the trained AI/ML model is further utilized to prescribe the recipe by analysing all the recipe data 320, the sensors data 322, and the metadata 324 to reduce scrap rate. The recipe suggested by the trained AI/ML model is first validated by the physics-based-simulation model. Upon validation, the optimized recipe may be utilized to produce the component which may have low scrap rate as compared to previous recipes.

Figure 6A:
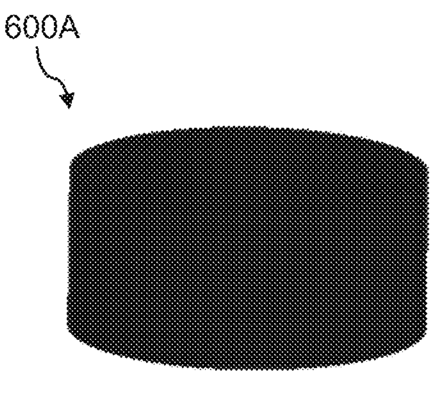
FIGS. 6A-C are exemplary process diagrams depicting a product, a simulation setup, and a temperature-time graph of a process, in accordance with an embodiment of the present disclosure.
Figure 6B:
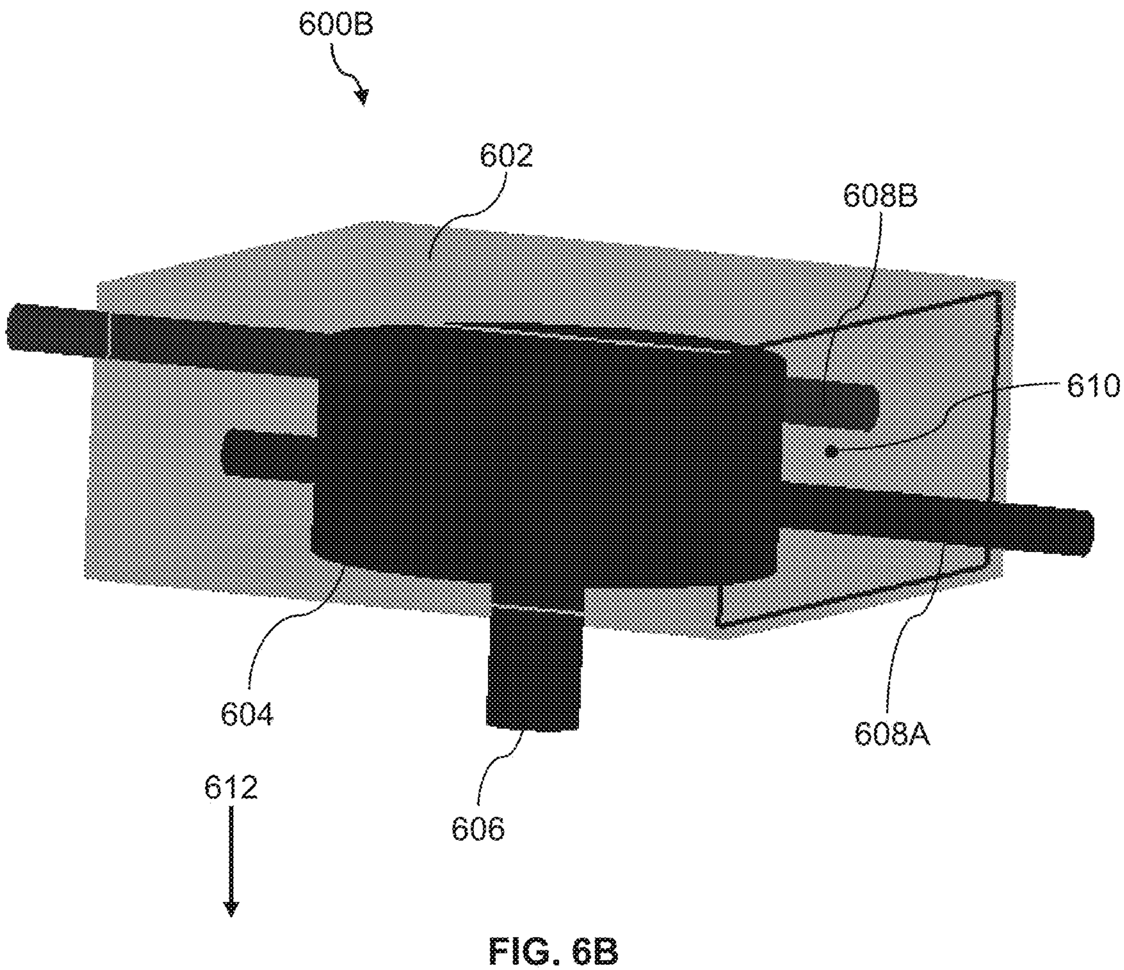
Figure 6C:
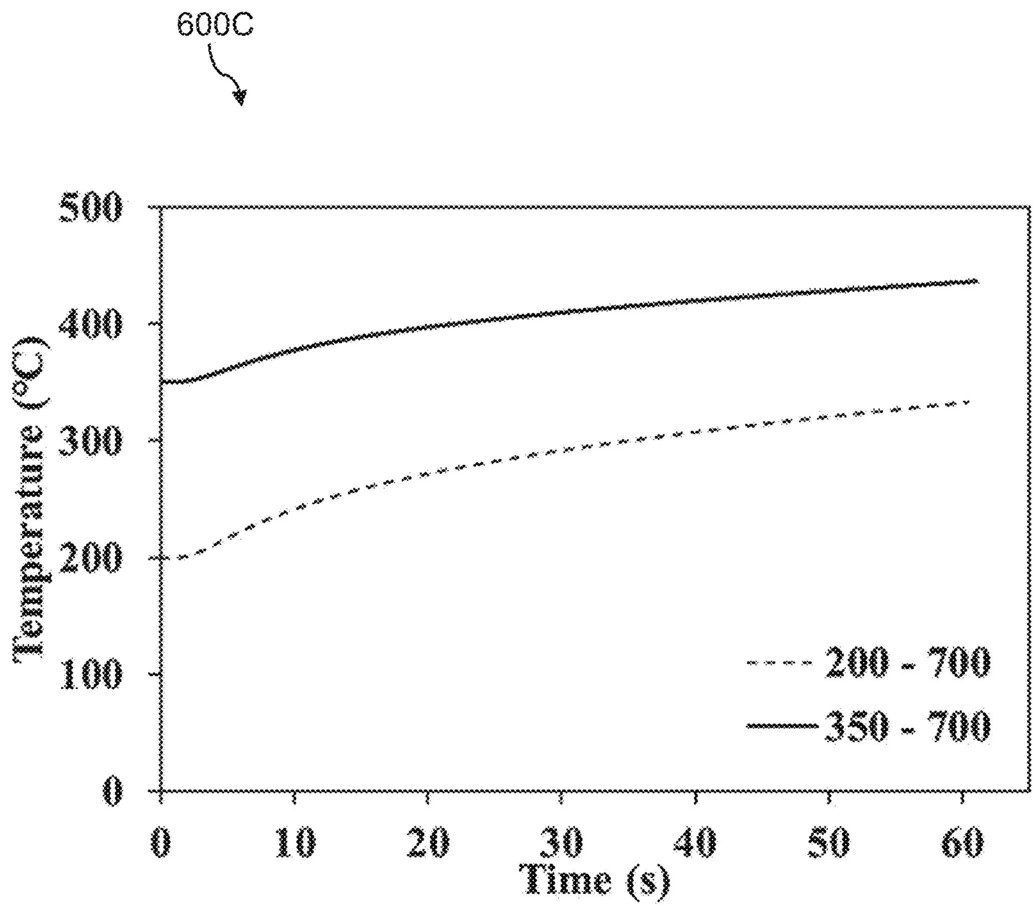

FIGS. 6A-C are exemplary process diagrams depicting a product 600A, a simulation setup 600B and a temperature-time graph of a process 600C, in accordance with an embodiment of the present disclosure. The process may be a Low Pressure Die Casting (LPDC) process. FIG. 6A depicts a cylindrical geometry 600A of the component which is produced through the LPDC process. However, the person having ordinary skill in the art can appreciate that the scope of the present disclosure can be extended for any geometry, any casting process, and for any material. The cylindrical component 600A is first produced through an experimental setup with some optimized recipes. The recipe includes the plurality of parameters including at least one of: molten metal temperature, pre-heat temperature of a die 602, cooling channel parameters, and the like. The one or more sensors 610 installed at a different location in the machine 102 which continuously measures different real-time parameters including at least one of: the temperature, the pressure, the flow of the air, and the like.

FIG. 6B depicts the simulation setup 600B (i.e., the physics-based-simulation setup) similar to the experimental setup. The physics-based-simulation setup includes the die 602, which consists of a cavity 604 of the cylindrical component 600A. The physics-based-simulation setup further includes a feeder tube 606. A molten metal enters the cavity 604 from the feeder tube 606 in the opposite direction of the gravity marked by arrow 612. Cooling channels 608A-B are utilized to cool the moulds.

The one or more sensors 610 are utilized to collect real-time temperature data during the process. After setting up the physics-based-simulation model, a physical range of parameters such as heat transfer coefficient and other parameters are adjusted such that the error between the sensor data 322 and the simulation data is minimized. After tuning these physical range of parameters and minimizing the error, the physics-based-simulation model is run with a different recipe and can generate the data which are not available through experiments.

FIG. 6C is a graphical representation 600C depicting a temperature curve generated through tuned simulation for 200° C. and 350° C. pre-heat temperature of the die 602 with 700° C. molten metal temperature. Using these data along with experimental data, the AI/ML model may capture the root cause (i.e., one or more flaws) behind a defective component and provide suitable prescriptions to reduce the defective component.

Figure 7:
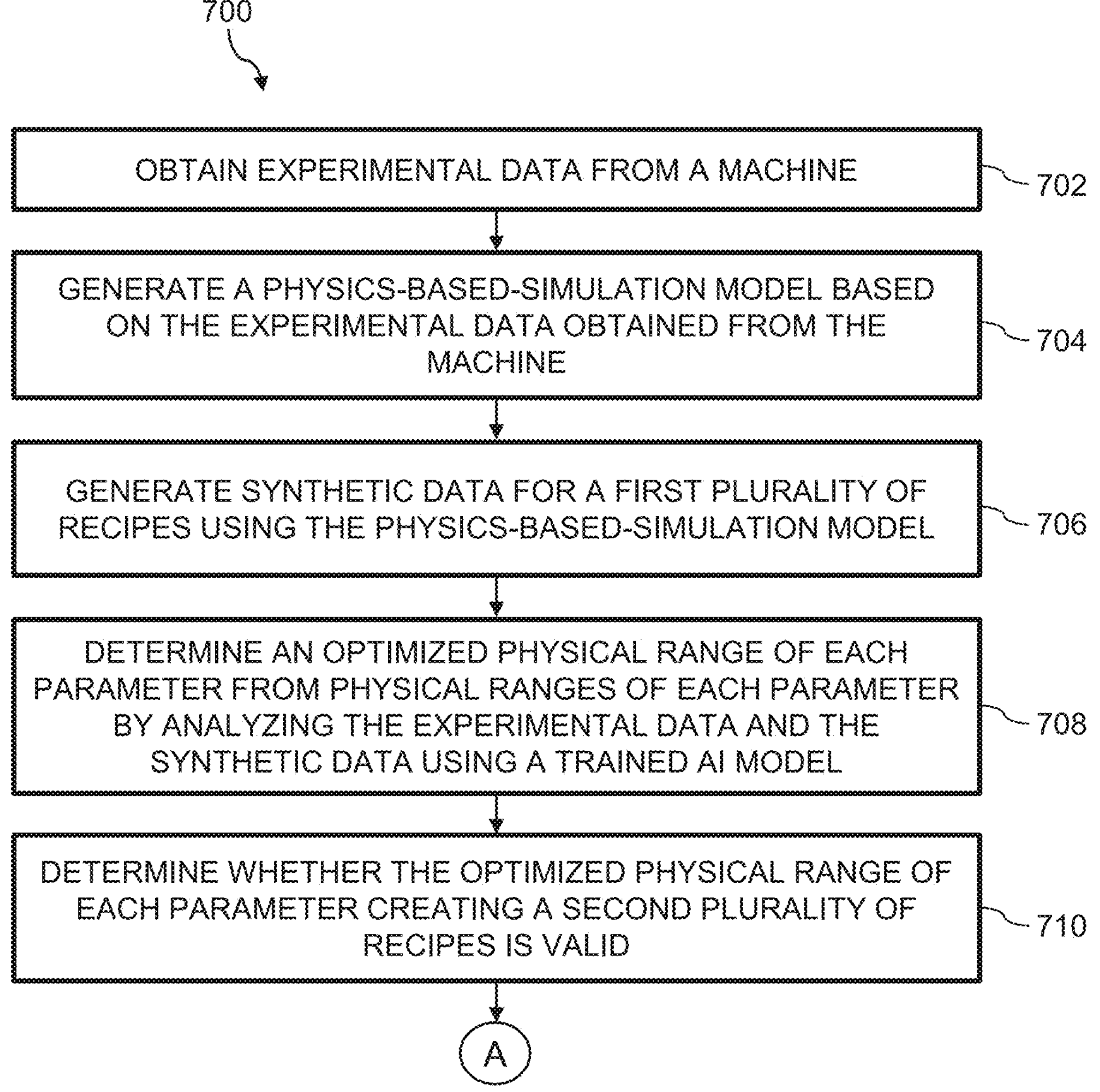
FIG. 7 is a flow chart depicting a computer-implemented method for recommending the recipe to produce the product in the manufacturing process, such as those shown in FIG. 1, in accordance with an embodiment of the present disclosure.
Figure 7:
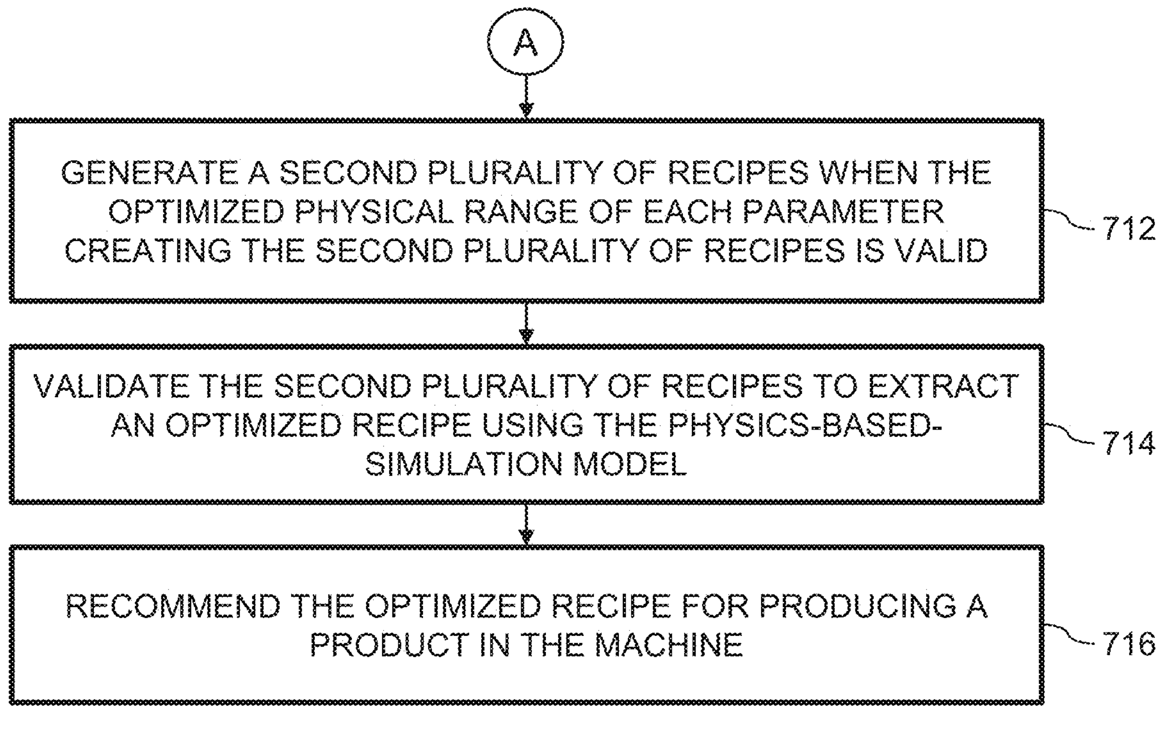

FIG. 7 is a flow chart depicting a computer-implemented method 700 for recommending the recipe to produce the product in the manufacturing process, such as those shown in FIG. 1, in accordance with an embodiment of the present disclosure. At step 702, the experimental data are obtained from the machine 102. In an embodiment, the experimental data include at least one of: the recipe data 320, the sensor data 322, and the metadata 324 of the machine 102. In an embodiment, the recipe data include the plurality of parameters that is set for the machine 102 to produce the product. At step 704, the physics-based-simulation model is generated based on the experimental data obtained from the machine.

At step 706, the synthetic data similar to the experimental data are generated for the list of recipes (i.e., the first plurality of recipes) using the physics-based-simulation model. In an embodiment, the list of recipes is created based on the process knowledge by considering the physical ranges of each parameter from the plurality of parameters.

At step 708, the optimized physical range of each parameter is determined from the physical ranges of each parameter by analyzing the experimental data and the synthetic data using the AI model. At step 710, it determines whether the optimized physical range of each parameter used to create the second plurality of recipes is valid based on the process knowledge.

In an embodiment, determining whether the optimized physical range of each parameter creating the second plurality of recipes is valid using the process knowledge includes steps of: (a) comparing the second plurality of recipes that are created by the optimized physical range of each parameter with predetermined plurality of recipes created from the plurality of parameters, and (b) determining whether the second plurality of recipes created by the optimized physical range of each parameter is valid based on the comparison of the second plurality of recipes that are created by the optimized physical range of each parameter with the predetermined plurality of recipes created from the plurality of parameters using the process knowledge.

At step 712, the plurality of recipes (i.e., the second plurality of recipes) is generated when the optimized physical range of each parameter used to create the second plurality of recipes is valid. At step 714, the plurality of recipes is validated to extract the optimized recipe using the physics-based-simulation model. At step 716, the optimized recipes are recommended for producing the product in the machine 102.

The present invention has the following advantages. The present invention considers all the environmental parameters, the maintenance parameters and other parameters to suggest the optimized recipe through the AI/ML model. The present invention utilizes the physics-based-simulation model to generate the synthetic data with the range of recipes. The generated synthetic data is further utilized to train the AI/ML model having exposure of the range of the recipe and higher accuracy in suggesting the optimized recipe. The present invention further validates the recipe through the physics-based-simulation model before starting the production through this optimized recipe. The validation through the physics-based-simulation model saves the material, energy and an effort at industries that are spent during the production of the component.

The Artificial Intelligence or Machine Learning (AI or ML) algorithms may be trained on the experimental process parameters, the sensor data 322, and the metadata 324 to determine the optimize process parameters by identifying a hidden pattern in the data. The present invention describes a methodology to integrate physics-based-simulation model to the AI/ML model in a bidirectional way. In forward direction, the present invention generates the synthetic data through physics-based-simulation model and utilizes that the synthetic data along with the experimental data to train the AI/ML model which makes the AI/ML model more accurate and helps in reducing the scrap rate. In the other direction, the present invention validates the recipe suggested by the AI/ML model through the physics-based-simulation model.

The physics-based-simulation model may be utilized to generate the synthetic data similar to the experimental data for different process parameters. These synthetic data along with the experimental data may be utilized to enhance the AI/ML model, which prescribes more accurate optimized recipe. The optimized recipe suggested by the AI/ML model should be within physical range and is validated through the physics-based-simulation model before starting the production.

The written description describes the subject matter herein to enable any person skilled in the art to make and use the embodiments. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

The embodiments herein can comprise hardware and software elements. The embodiments that are implemented in software include but are not limited to, firmware, resident software, microcode, and the like. The functions performed by various modules described herein may be implemented in other modules or combinations of other modules. For the purposes of this description, a computer-usable or computer readable medium can be any apparatus that can comprise, store, communicate, propagate, or transport the program for use by or in connection with the instruction execution system, an apparatus, or a device.

The medium can be an electronic, a magnetic, an optical, an electromagnetic, an infrared, or a semiconductor system (or an apparatus or a device) or a propagation medium. Examples of a computer-readable medium include a semiconductor or solid-state memory, a magnetic tape, a removable computer diskette, a random-access memory (RAM), a read-only memory (ROM), a rigid magnetic disk and an optical disk. Current examples of optical disks include a compact disk-read only memory (CD-ROM), a compact disk-read/write (CD-R/W) and a DVD.

Input/output (I/O) devices (including but not limited to keyboards, displays, pointing devices, and the like.) can be coupled to the system 100 either directly or through intervening I/O controllers. Network adapters may also be coupled to the system 100 to enable a data processing system to become coupled to other data processing systems or remote printers or storage devices through intervening private or public networks. Modems, cable modem and Ethernet cards are just a few of the currently available types of network adapters.

A representative hardware environment for practicing the embodiments may include a hardware configuration of an information handling/computer system in accordance with the embodiments herein. The system herein comprises at least one of: a processor or a central processing unit (CPU). The CPUs are interconnected via the system bus 214 to various devices such as a random-access memory (RAM), read-only memory (ROM), and an input/output (I/O) adapter. The I/O adapter can connect to peripheral devices, such as disk units and tape drives, or other program storage devices that are readable by the system 100. The system 100 can read the inventive instructions on the program storage devices and follow these instructions to execute the methodology of the embodiments herein.

The system 100 further includes a user interface adapter that connects a keyboard, a mouse, a speaker, a microphone, and/or other user interface devices such as a touch screen device (not shown) to the bus to gather user input. Additionally, a communication adapter connects the bus to a data processing network, and a display adapter connects the bus to a display device which may be embodied as an output device such as a monitor, a printer, or a transmitter, for example.

A description of an embodiment with several components in communication with each other does not imply that all such components are required. On the contrary, a variety of optional components are described to illustrate the wide variety of possible embodiments of the invention. When a single device or article is described herein, it will be apparent that more than one device/article (whether or not they cooperate) may be used in place of a single device/article. Similarly, where more than one device or article is described herein (whether or not they cooperate), it will be apparent that a single device/article may be used in place of the more than one device or article, or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, and the like. Of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open-ended in that an item or items following any one of these words is not meant to be an exhaustive listing of such item or items or meant to be limited to only the listed item or items. It must also be noted that as used herein and in the appended claims, the singular forms "a," "an," and "the" include plural references unless the context clearly dictates otherwise.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based here on. Accordingly, the embodiments of the present invention are intended to be illustrative, but not limiting, of the scope of the invention, which is set forth in the following claims.

We claim:

1. A computer-implemented method for recommending a recipe to produce a product in a manufacturing process, the computer-implemented method comprising:

obtaining, by one or more hardware processors, experimental data from a machine, wherein the experimental data comprise at least one of: recipe data, sensor data, and metadata of the machine, wherein the recipe data comprise a plurality of parameters that are set for the machine to produce the product, wherein the metadata comprise a label corresponding to at least one of: a defective or a non-defective part of the machine, a geometry, a location of the one or more sensors, a product type, information related to maintenance, environmental parameters, information related to replacing the part of the machine and information related to the machine, and a machine part;

generating, by the one or more hardware processors, a physics-based-simulation model based on the experimental data obtained from the machine, wherein generating the physics-based-simulation model comprises:

extracting, by the one or more hardware processors, simulation data from one or more sensors that are installed in the machine;

determining, by the one or more hardware processors, an error between the extracted simulation data and experimental sensor data;

determining, by the one or more hardware processors, whether the error exceeds a threshold value;

tuning, by the one or more hardware processors, the physics-based-simulation model iteratively by adjusting a value of a physical range of each parameter when the error exceeds the threshold value;

generating, by the one or more hardware processors, synthetic data for a first plurality of recipes using the physics-based-simulation model, wherein the synthetic data comprise synthetic data similar to the experimental data and are utilized only when the error is within the threshold value, and wherein the first plurality of recipes is created based on physical ranges of each parameter from the plurality of parameters;

training, by the one or more hardware processors, an artificial intelligence (AI) model using the experimental data and the synthetic data;

determining, by the one or more hardware processors, an optimized physical range of each parameter from the physical ranges of each parameter by analyzing the experimental data and the synthetic data using the trained AI model;

determining, by the one or more hardware processors, whether the optimized physical range of each parameter creating a second plurality of recipes is valid based on process knowledge, wherein the process knowledge comprises at least one of: knowledge of the manufacturing process and corresponding machines, one or more sensors, parameters set to the machine, parameters measured through the one or more sensors, and limits of the plurality of parameters;

generating, by the one or more hardware processors, the second plurality of recipes when the optimized physical range of each parameter creating the second plurality of recipes is valid;

validating, by the one or more hardware processors, the second plurality of recipes to extract an optimized recipe using the physics-based-simulation model; and recommending, by the one or more hardware processors, the optimized recipe for producing the product in the machine.

2. The computer-implemented method as claimed in claim 1, wherein generating the physics-based-simulation model comprises:

obtaining, by the one or more hardware processors, input data from the machine, wherein the input data comprise at least one of: geometries of the product in a form of computer aided design (CAD) model, material properties of the product and one or more parts of the machine, the plurality of parameters that are set for the machine for producing the product, and initial and boundary conditions that are identified based on the experimental data and applied in the physics-based-simulation model, wherein the geometries of the product comprise die and sub-parts of the machine which are assembled in the CAD model similar to an experimental setup of the product; and generating, by the one or more hardware processors, the physics-based-simulation model by providing initial values for the physical range of each parameter.

3. The computer-implemented method as claimed in claim 1, wherein determining the optimized physical range of each parameter from the physical ranges of each parameter using the trained AI model comprises:

performing, by the one or more processors, data cleaning and preparation processes, wherein the data cleaning and preparation processes comprise at least one of: removing outliers and handling missing data;

extracting, by the one or more hardware processors, statistical features from the data comprising at least one of: mean, median, standard deviation, an area under curve from the one or more sensors;

splitting, by the one or more processors, the extracted statistical features into a train set and a test set;

training, by the one or more hardware processors, the AI model based on hyper- parameters of the AI model on the train set;

evaluating, by the one or more hardware processors, the trained AI model on the test set;

determining, by the one or more hardware processors, one or more flaws using the trained AI model to provide recommendations for a defective product; and recommending, by the one or more processors, the optimized recipe by analyzing the experimental data using the trained AI model.

4. The computer-implemented method as claimed in claim 1, wherein validating the second plurality of recipes to extract the optimized recipe using the physics-based-simulation model comprises:

simulating, by the one or more hardware processors, the second plurality of recipes to generate a plurality of outputs of the product from the machine, wherein the plurality of outputs comprises at least one of: a size, a shape and a location of a defect, a hot spot location, temperature distribution in a mold in the machine;

analyzing, by the one or more hardware processors, the plurality of outputs generated for the second plurality of recipes; and comparing, by the one or more hardware processors, the second plurality of recipes with the plurality of outputs to extract the optimized recipe from the second plurality of recipes.

5. The computer-implemented method as claimed in claim 1, wherein the plurality of parameters comprises at least one of: molten metal temperature, pre-heat temperature, cooling channel parameters, heat transfer coefficient between the mold and a molten metal, the heat transfer coefficient between the mold and a cooling channel, pressure, and flow of air, which are set for the machine to produce the product, and wherein the machine is a low pressure die casting (LPDC) machine.

6. The computer-implemented method as claimed in claim 1, wherein the recipe data comprise the plurality of parameters that are set for the machine to produce a type of the product, wherein the sensor data comprise data collected from the one or more sensors installed on the machine.

7. A system for recommending a recipe to produce a product in a manufacturing process, the system comprising:

one or more hardware processors; and a memory coupled to the one or more hardware processors, wherein the memory comprises a set of program instructions in the form of a plurality of subsystems, configured to be executed by the one or more hardware processors, wherein the plurality of subsystems comprises:

a data obtaining subsystem configured to obtain experimental data from a machine, wherein the experimental data comprise at least one of: recipe data, sensor data, and metadata of the machine, wherein the recipe data comprise a plurality of parameters that are set for the machine to produce the product, wherein the metadata comprise a label corresponding to at least one of: a defective or a non-defective part of the machine, a geometry, a location of the one or more sensors, a product type, information related to maintenance, environmental parameters, information related to replacing the part of the machine and information related to the machine, and a machine part;

a simulation generation subsystem configured to:

generate a physics-based-simulation model based on the experimental data obtained from the machine;

extract simulation data from one or more sensors that are installed in the machine;

determine an error between the extracted simulation data and experimental sensor data;

determine whether the error exceeds a threshold value;

tune the physics-based-simulation model iteratively by adjusting a value of a physical range of each parameter when the error exceeds the threshold value;

a synthetic data generation subsystem configured to generate synthetic data for a first plurality of recipes using the physics-based-simulation model, wherein the synthetic data comprise synthetic data similar to the experimental data and are generated only when the error is within the threshold value, and wherein the first plurality of recipes is created based on physical ranges of each parameter from the plurality of parameters;

train an artificial intelligence (AI) model using the experimental data and the synthetic data;

a recipe recommendation subsystem configured to:

determine an optimized physical range of each parameter from the physical ranges of each parameter by analyzing the experimental data and the synthetic data using the trained AI model;

determine whether the optimized physical range of each parameter creating a second plurality of recipes is valid based on process knowledge, wherein the process knowledge comprises at least one of: knowledge of the manufacturing process and corresponding machines, one or more sensors, parameters set to the machine, parameters measured through the one or more sensors, and limits of the plurality of parameters;

generate the second plurality of recipes when the optimized physical range of each parameter creating the second plurality of recipes is valid;

validate the second plurality of recipes to extract an optimized recipe using the physics-based-simulation model; and recommend the optimized recipe for producing the product in the machine.

8. The system as claimed in claim 7, wherein in generating the physics-based-simulation model, the simulation generation subsystem configured to:

obtain input data from the machine, wherein the input data comprise at least one of: geometries of the product in a form of computer aided design (CAD) model, material properties of the product and one or more parts of the machine, the plurality of parameters that are set for the machine for producing the product, and initial and boundary conditions that are identified based on the experimental data and applied in the physics-based-simulation model, wherein the geometries of the product comprise die and sub-parts of the machine which are assembled in the CAD model similar to an experimental setup of the product; and generate the physics-based-simulation model by providing initial values for the physical range of each parameter.

9. The system as claimed in claim 7, wherein in determining the optimized physical range of each parameter from the physical ranges of each parameter using the trained AI model, the recipe recommendation subsystem configured to:

perform data cleaning and preparation processes, wherein the data cleaning and preparation processes comprise at least one of: removing outliers and handling missing data;

extract statistical features from the data comprising at least one of: mean, median, standard deviation, an area under curve from the one or more sensors;

split the extracted statistical features into a train set and a test set;

train the AI model based on hyper-parameters of the AI model on the train set;

evaluate the trained AI model on the test set;

determine one or more flaws using the trained AI model to provide recommendations for a defective product; and recommend the optimized recipe by analyzing the experimental data using the trained AI model.

10. The system as claimed in claim 7, wherein in validating the second plurality of recipes to extract the optimized recipe using the physics-based-simulation model, the recipe recommendation subsystem configured to:

simulate the second plurality of recipes to generate a plurality of outputs of the product from the machine, wherein the plurality of outputs comprises at least one of: a size, a shape and a location of a defect, a hot spot location, temperature distribution in a mold in the machine;

analyze the plurality of outputs generated for the second plurality of recipes; and compare the second plurality of recipes with the plurality of outputs to extract the optimized recipe from the second plurality of recipes.

11. The system as claimed in claim 7, wherein the plurality of parameters comprises at least one of: molten metal temperature, pre-heat temperature, cooling channel parameters, heat transfer coefficient between the mold and a molten metal, the heat transfer coefficient between the mold and a cooling channel, pressure, and flow of air, which are set for the machine to produce the product, and wherein the machine is a low pressure die casting (LPDC) machine.

12. The system as claimed in claim 7, wherein the recipe data comprise the plurality of parameters that are set for the machine to produce a type of the product, wherein the sensor data comprise data collected from the one or more sensors installed on the machine.

* * * * *